United States Patent
Shum et al.

(10) Patent No.: US 7,495,279 B2
(45) Date of Patent: Feb. 24, 2009

(54) EMBEDDED FLASH MEMORY DEVICES ON SOI SUBSTRATES AND METHODS OF MANUFACTURE THEREOF

(75) Inventors: Danny Pak-Chum Shum, Poughkeepsie, NY (US); Armin Tilke, Beacon, NY (US); Jiang Yan, Newburgh, NY (US)

(73) Assignee: Infineon Technologies AG, Munich (DE)

( * ) Notice: Subject to any disclaimer, the term of this patent is extended or adjusted under 35 U.S.C. 154(b) by 503 days.

(21) Appl. No.: 11/223,235

(22) Filed: Sep. 9, 2005

(65) Prior Publication Data

US 2007/0057307 A1 Mar. 15, 2007

(51) Int. Cl.
*H01L 29/76* (2006.01)
(52) U.S. Cl. .................... 257/314; 257/326
(58) Field of Classification Search ................ 257/314, 257/316, 324, 326, 347, 390, 500
See application file for complete search history.

(56) References Cited

U.S. PATENT DOCUMENTS

| | | | |
|---|---|---|---|
| 5,471,422 | A | 11/1995 | Chang et al. |
| 6,307,781 | B1 | 10/2001 | Shum |
| 6,314,021 | B1 | 11/2001 | Maeda et al. |
| 6,438,030 | B1 | 8/2002 | Hu et al. |
| 6,608,345 | B2 * | 8/2003 | Kunikiyo et al. ............ 257/314 |
| 6,628,544 | B2 | 9/2003 | Shum et al. |
| 6,841,824 | B2 | 1/2005 | Shum |
| 6,864,151 | B2 | 3/2005 | Yan et al. |
| 6,909,139 | B2 | 6/2005 | Shum et al. |
| 2005/0179079 | A1 | 8/2005 | Wu |

FOREIGN PATENT DOCUMENTS

KR  2001-0110976  12/2001

OTHER PUBLICATIONS

Burnett, D., et al., "An Advanced Flash Memory Technology on SOI," IEDM 98, 1998, pp. 983-986, IEEE.
Chan, A. C.-K., et al., "Effects of Floating Body on Double Polysilicon Partially Depleted SOI Nonvolatile Memory Cell," IEEE Electron Device Letters, 2003, pp. 1-3, IEEE.
Chan, A.C.K., et al., "SOI Flash Memory Scaling Limit and Design Consideration Based on 2-D Analytical Modeling," IEEE Transactions on Electron Devices, Dec. 2004, pp. 2054-2060, vol. 51, No. 12, IEEE.
Chi, M.-h., et al., "Programming and Erase with Floating-Body for High Density Low Voltage Flash EEPROM Fabricated on SOI Wafers," Proceedings 1995 IEEE International SOI Conference, Oct. 1995, pp. 129-130, 95CH35763, IEEE.
Lončar, B., et al., "One of Application of SOI Memory Cell—Memory Array," Proc. 22nd International Conference on Microelectronics (MIEL2000), May 14-17, 2000, pp. 455-458, vol. 2, IEEE, Niš, Serbia.

* cited by examiner

*Primary Examiner*—Tuan H Nguyen
(74) *Attorney, Agent, or Firm*—Slater & Matsil, L.L.P.

(57) ABSTRACT

Flash memory device structures and methods of manufacture thereof are disclosed. The flash memory devices are manufactured on silicon-on-insulator (SOI) substrates. Shallow trench isolation (STI) regions and the buried oxide layer of the SOI substrate are used to isolate adjacent devices from one another. The methods of manufacture require fewer lithography masks and may be implemented in stand-alone flash memory devices, embedded flash memory devices, and system on a chip (SoC) flash memory devices.

15 Claims, 6 Drawing Sheets

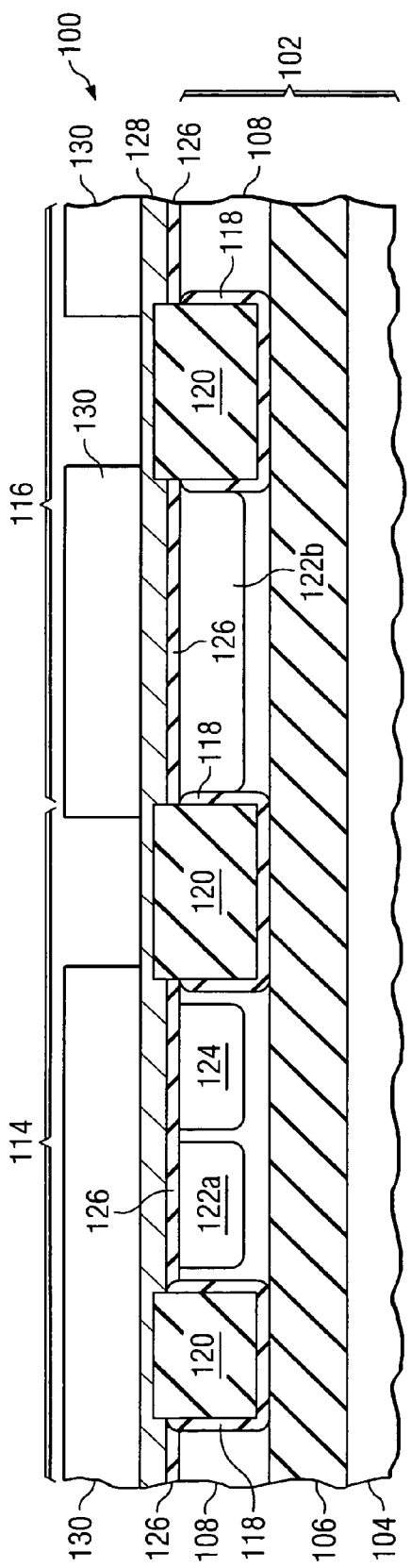
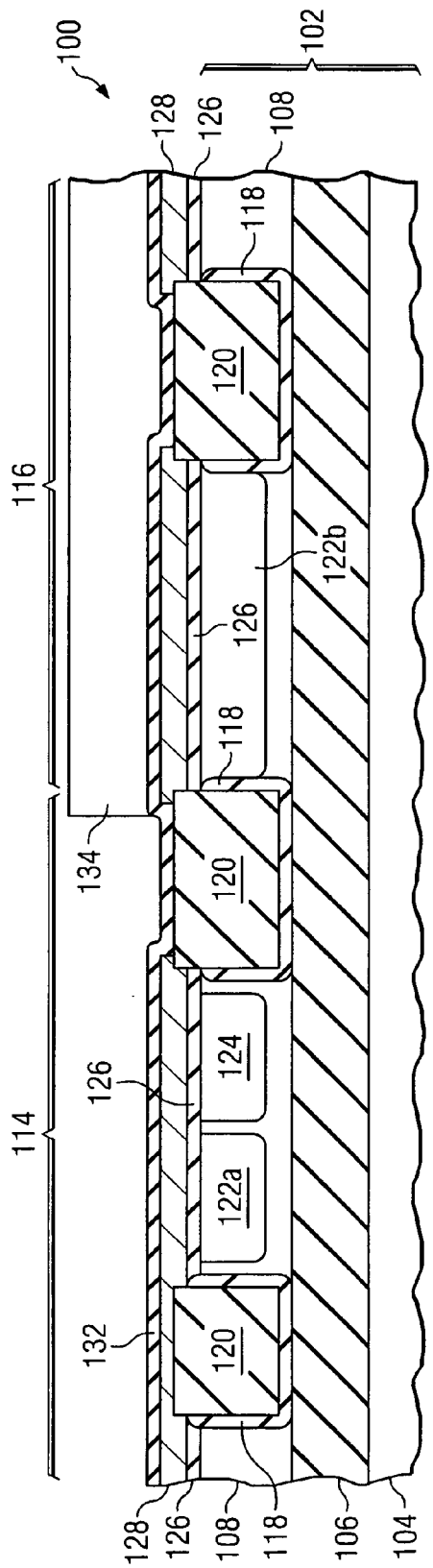
FIG. 3
FIG. 4

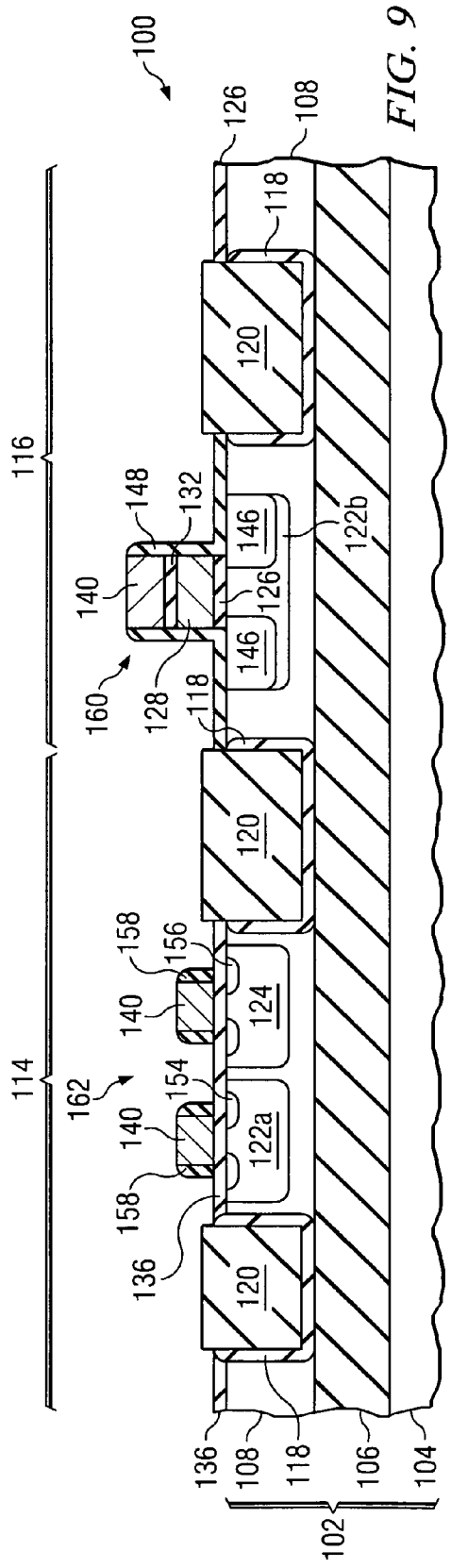
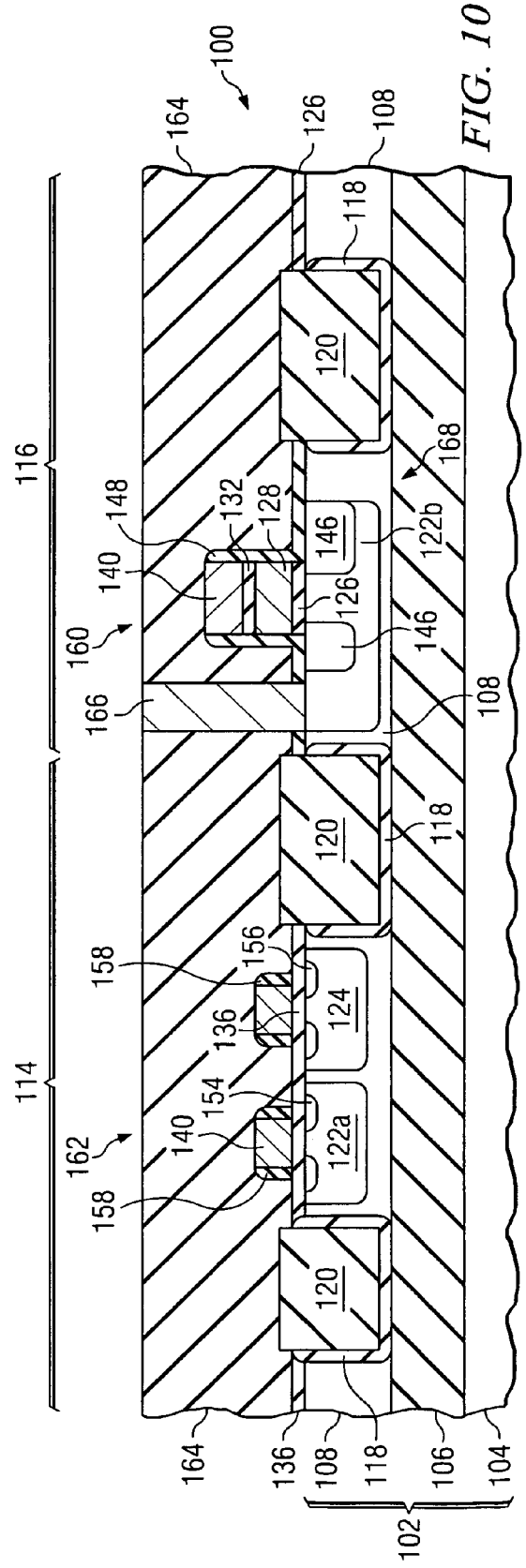

EMBEDDED FLASH MEMORY DEVICES ON SOI SUBSTRATES AND METHODS OF MANUFACTURE THEREOF

TECHNICAL FIELD

The present invention relates generally to the manufacture of semiconductor devices, and more particularly to methods of manufacturing and structures for flash memory devices.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0." Memory devices may be static or dynamic. Dynamic memory devices need to be refreshed to "remember" the data, whereas static memory devices do not need to be refreshed to retain stored data.

One type of static memory device, also referred to in the art as a non-volatile memory (NVM) device, is a flash memory device. A flash memory device is an electrically erasable programmable read only memory (EEPROM) that is commonly used in computers, digital cameras, MP3 players, gaming systems, and memory sticks, as examples, although flash memory devices may be used in other applications, as well. Flash memory devices do not require power to retain stored data; they retain data even when the power source is disconnected. In flash memory devices, in-circuit wiring is used to erase predetermined sections or blocks of the chip by applying an electrical field to the entire chip, for example.

Flash memory devices typically comprise an array of flash memory cells. Flash memory cells are accessible for programming and retrieving data by an array of wordlines and bitlines coupled to the array of flash memory cells. Each flash memory cell comprises a floating gate and a control gate, which are separated by a thin insulator. Flash memory cells are programmed by applying a voltage to the control gate. Flash memory cells store a charge in the floating gate and are programmed using Fowler-Nordheim tunneling or channel hot electron injection from the channel or source and drain regions.

Recent flash memory applications include "embedded flash memory" and system on a chip (SoC) devices, in which an array of flash memory cells and peripheral circuitry for the flash memory cells are formed on a single chip or integrated circuit. The peripheral circuitry may comprise high voltage circuits, logic circuits for microcontrollers or processors, and other types of devices that may comprise transistors, diodes, bandgap devices, capacitors, inductors, and linear devices, as examples, although other types of devices may be included in the peripheral circuitry.

Embedded flash memory devices and SoC devices are more difficult to manufacture and require more manufacturing process steps and lithography masks to produce them.

What are needed in the art are improved methods of manufacturing embedded flash memory devices and structures thereof that require fewer dedicated lithography masks and processing steps for the flash memory portion of the chip.

Furthermore, flash memory is a relatively new technology, and there are limitations in further reducing the size of flash memory cells in current designs in the industry. Flash memory is more expensive to manufacture than traditional forms of memory, such as DRAMs.

Thus, what are also needed in the art are improved flash memory designs having lower manufacturing costs and reduced size.

Silicon-on-insulator (SOI) substrates have been used in the semiconductor industry in devices other than flash memory devices to achieve high performance and lower power dissipation for SoC applications. As an example, PowerPC™ microprocessors by International Business Machines (IBM) Corporation are manufactured on SOI substrates. However, SOI substrates have not yet been successfully used in flash memory devices because of a floating body effect that deleteriously affects the performance and reliability of the flash memory cells, to be described further herein.

Thus, what is also needed in the art is a means of integrating flash memory devices on SOI substrates for SoC devices, in order to achieve lower dissipation power and increased performance.

SUMMARY OF THE INVENTION

These and other problems are generally solved or circumvented, and technical advantages are generally achieved, by preferred embodiments of the present invention, in which flash memory cells are formed on SOI substrates for SoC applications. The buried oxide of the SOI substrate is utilized to facilitate the isolation of adjacent flash memory cells. Wells of the flash memory cells are biased, reducing GIDL leakage and resulting in better isolation, reliability, and improved performance.

In accordance with a preferred embodiment of the present invention, a semiconductor device includes an SOI substrate, the SOI substrate including a substrate, a buried insulating layer disposed over the substrate, and a layer of semiconductor material disposed over the buried insulating layer. The semiconductor device includes a plurality of isolation regions disposed in the layer of semiconductor material, wherein each isolation region extends completely through the layer of semiconductor material. The semiconductor device includes a plurality of flash memory cells formed on the SOI substrate, each flash memory cell having a body, the plurality of flash memory cells being arranged in an array of rows and columns. Each column of flash memory cells is formed in a continuous region of the semiconductor layer and is separated from adjacent columns of flash memory cells by an isolation region such that the body of each flash memory cell in a column is electrically coupled to the bodies of each other flash memory cell in that column but is electrically isolated from the bodies of each flash memory cell in other columns.

In accordance with another preferred embodiment of the present invention, a method of manufacturing a semiconductor device includes providing an SOI substrate, the SOI substrate including a substrate, a buried insulating layer disposed over the substrate, and a layer of semiconductor material disposed over the buried insulating layer. A plurality of isolation regions is formed in the layer of semiconductor material, each isolation region extending completely through the layer of semiconductor material. An array of a rows and columns of flash memory cells is formed on the SOI substrate, each flash memory cell including a body, each column of flash memory cells being formed in a continuous region of the semiconductor layer and being separated from adjacent columns of flash memory cells by an isolation region. An electrical connection is provided to each column of flash memory cells so that the body of each flash memory cell in any column can be biased independently with respect to the other columns of flash memory cells.

In accordance with yet another preferred embodiment of the present invention, a method of operating a flash memory array includes providing an array of flash memory cells arranged in rows and columns, each flash memory cell having a body and each column of flash memory cells being formed in a continuous region of semiconductor that overlies a buried insulator. Each column is separated from adjacent columns of flash memory cells by an isolation region. A flash memory cell is selected in one of the columns, and a first voltage is applied to the body of each flash memory cell in the one of the columns. A second voltage is applied to the body of each flash memory cell in a column that is immediately adjacent the one of the columns, and the selected flash memory cell is accessed.

Advantages of preferred embodiments of the present invention include providing flash memory cell designs that are scalable and have improved performance. The novel methods of manufacturing the flash memory devices and structures thereof described herein have a reduced number of manufacturing process steps and require fewer lithography masks, reducing manufacturing costs. Embedded flash memory devices and SoC devices that utilize SOI substrates to boost performance may be manufactured utilizing the structures and methods described herein. The flash memory cells may comprise twin or triple wells.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 through 10 show cross-sectional views of an embedded flash memory device at various stages of manufacturing in accordance with a preferred embodiment of the present invention;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
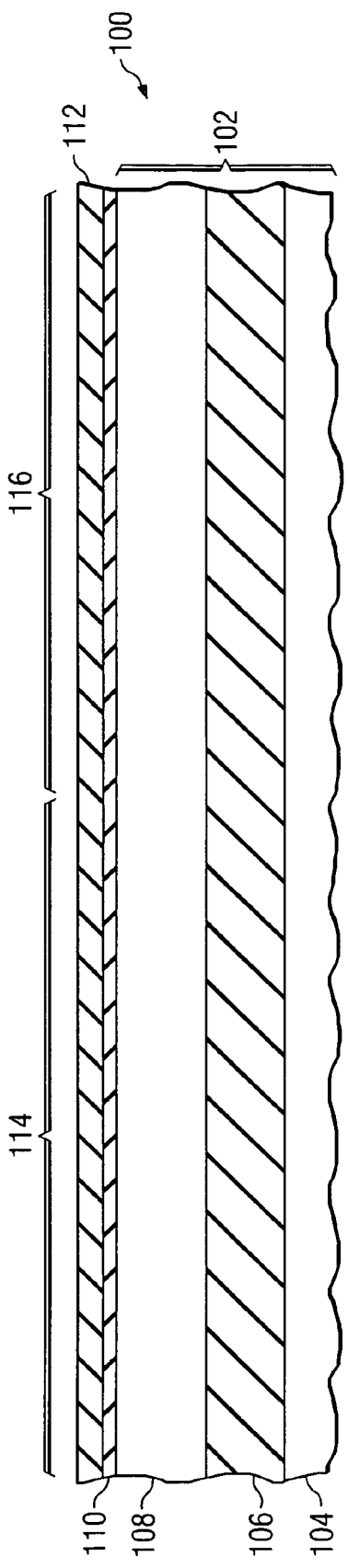
Figure 2:
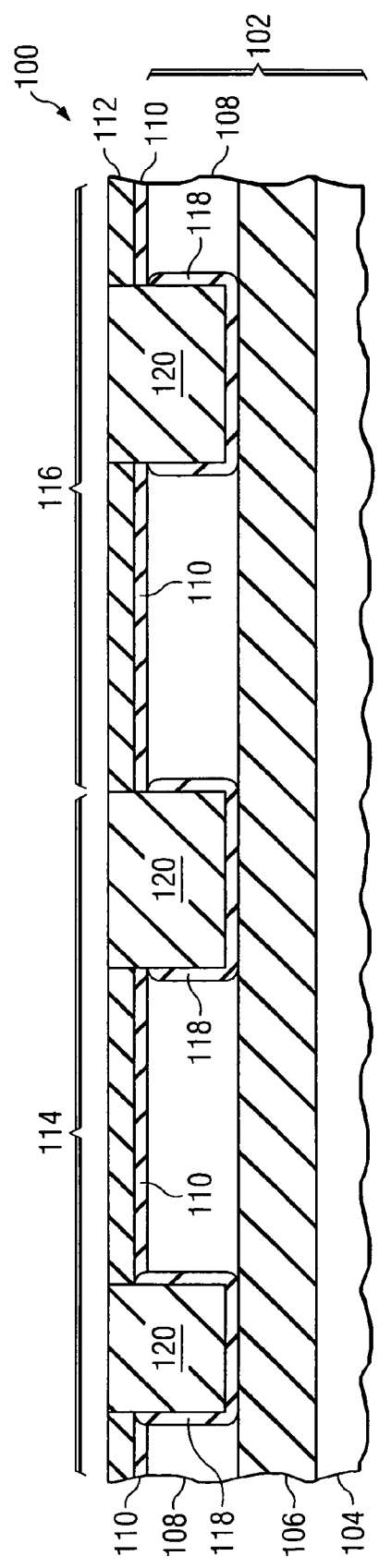

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Flash memory devices are typically formed using a triple well configuration in a bulk substrate: a substrate has a first dopant type, e.g., P type, and is considered a first well, a second well is formed in the substrate of a second dopant type, e.g., an N-well, and a third well is formed within the second well comprising the first dopant type, e.g., a P-well. Alternatively, the first well and third well may comprise N-type and the second well may comprise P-type, for example. The third well of a flash memory device is often referred to in the art as a "body," for example.

In flash memory device fabrication, isolating adjacent third wells, e.g., the P-wells in the first example above, is required. U.S. Pat. No. 6,909,139, which is incorporated herein by reference, entitled "One Transistor Flash Memory Cell," issued on Jun. 21, 2005 to Shum, et al., discloses a flash memory design wherein the P-wells of EEPROMs are isolated from one another by deep trenches. However, this method requires an additional lithography mask to pattern the deep trenches, and additional etching and deposition steps to etch and fill the deep trenches with insulating material, which adds costs and complexity to the manufacturing process.

Another method of isolating P-wells is disclosed in U.S. Pat. No. 6,438,030, entitled "Non-Volatile Memory, Method of Manufacture, and Method of Programming," issued on Aug. 20, 2002 to Hu, et al., which is incorporated herein by reference. Shallow or deep trench isolation is used to isolate P-wells of the memory cells. However, the P-wells in this design are too shallow and are not compatible with high voltage (HV) device designs, which require higher junction breakdown voltages, e.g., about 12 volts or greater, for flash memory operations. Hence, this prior art design requires two additional HV well masks to form the two HV wells, e.g., for an n channel field effect transistor (NFET) and p channel field effect transistor (PFET) that deliver the higher junction breakdown voltages.

In a paper by Burnett, et al., entitled, "An Advanced Flash Memory Technology on SOI," published in IEDM 98, 1998, pp. 983-986, IEEE, which is incorporated herein by reference, a flash memory cell is formed using a SOI substrate. LOCal Oxidation of Silicon (LOCOS) type isolation is used, wherein a thick layer of thermally grown silicon dioxide is used to separate adjacent devices, with DiNOR-like bias (drain-side bias in writing to low Vt states, and FN-FN erase in high Vt states). However, the structure involves floating bodies that are formed on top of the buried oxide (BOX) in the SOI substrates. The floating bodies are not connected to the common P-well (e.g., the third well or body of the flash memory cells), namely, the P-wells of the flash memory cells are not biased. The SOI (e.g., the combination of the BOX and STI) insulates the P-wells, making the flash cells have floating P-wells, e.g., the P-wells are allowed to float, electrically. The floating bodies cause hot hole generation and can charge up the floating body by capacitive coupling, which is a reliability concern. The hot hole generation causes device failures due to tunnel oxide degradation.

The problems caused by floating bodies are described in a paper by Chan, et al., entitled, "Effects of Floating Body on Double Polysilicon Partially Depleted SOI Nonvolatile Memory Cell," IEEE Electron Device Letters, 2003, pp. 1-3, 0741-3103/03, IEEE, which is also incorporated herein by reference. The floating body effect introduces instability in the value of the drain current during sensing and extra hot-electron gate current in programming, deleteriously effecting the read and write operations to a flash memory cell.

What is needed in the art is a means of isolating P-wells of flash memory devices that avoids the floating body effect, wherein forming the isolation is inexpensive and low in complexity. What is also needed is a means of forming such isolation that is integratable in embedded flash memory devices that include high voltage (e.g., having greater than about 12 V operating voltage) CMOS devices.

Embodiments of the present invention provide manufacturing processes and structures for flash memory devices formed on SOI substrates. The manufacturing process flow is more efficient and less costly, having a reduced number of lithography masks and manufacturing process steps, and provides the ability to further reduce the size of flash memory cells. The bodies or wells of flash memory cells formed on SOI substrates are biased, avoiding the floating body effect.

The present invention will be described with respect to preferred embodiments in a specific context, namely, implemented in embedded flash memory devices. The invention may also be applied, however, to other applications, such as stand-alone flash memory arrays that do not have built-in or on-chip support circuitry and devices, for example.

FIGS. 1 through 10 show cross-sectional views of a semiconductor device 100 at various stages of manufacturing in accordance with a preferred embodiment of the present invention. First, a workpiece 102 comprising a silicon-on-insulator (SOI) substrate 102 is provided. The SOI substrate 102 preferably comprises a first layer of semiconductive material 104 that may comprise silicon, for example, attached to a buried oxide layer 106. The buried oxide layer 106 may comprise silicon dioxide or other insulating materials, and is also referred to herein as a buried insulating layer. A second layer of semiconductive material 108 is disposed on the other side of the buried oxide layer 106, as shown. The second layer of semiconductive material 108 is typically thinner than the first layer of semiconductive material 104, for example. The semiconductor material layers 104 and 108 may comprise Si, SiGe, Ge, or other semiconductor materials or combinations of semiconductive materials, as examples.

The first layer of semiconductive material 104 may comprise a substrate comprising a thickness of about 400 µm or greater, the buried oxide layer 106 may comprise a thickness of about 0.3 µm or less, and the second layer of semiconductive material 108 may comprise a thickness of about 0.2 µm or less, as examples, although these layers may alternatively comprise other dimensions, for example. The second layer of semiconductive material 108 may be partially depleted or fully depleted, for example, according to its thickness. For example, a thicker layer 108 is generally considered a partially depleted SOI, while a thinner layer 108 is considered a fully depleted SOI. The first layer and second layer of semiconductive material 104 and 108 may be implanted with dopants, e.g., they may be N-type or P-type, for example. In the example shown, the first layer and second layer of semiconductive material 104 and 108 are P-type to form N-channel flash memory. However, embodiments of the present invention may also comprise N-type layers 104 and 108 that form a P-channel flash memory device, for example.

A pad oxide 110 and a pad nitride 112 are formed over the second layer of semiconductive material 108. The pad oxide 110 may comprise a thickness of about 5 nm, and the pad nitride 112 may comprise a thickness of about 100 to 150 nm, as examples, although alternatively, the pad oxide 110 and pad nitride 112 may comprise other dimensions.

The semiconductor device comprises a first region 114 and a second region 116. The first region 114 comprises a region where peripheral devices will be formed, and the second region 116 comprises a region where flash memory cells will be formed. The peripheral devices may comprise support circuitry and devices for the flash memory cells, for example. The peripheral devices may comprise logic devices such as logic for microcontrollers or processors, high voltage devices, low voltage devices, power devices, control devices for reading and writing to the flash memory cells, and/or combinations thereof, for example. The peripheral devices in the first region 114 may be operationally coupled to the flash memory cells in the second region 116. In some embodiments, the peripheral devices may be adapted to perform functions unrelated to the access of information to or from the flash memory cells, for example.

The flash memory cells in the second region 116 will be formed in an array of rows and columns, and will be addressed using conductive lines arranged in rows and columns, also referred to as wordlines and bitlines, for example. Each column of flash memory cells is formed in a continuous region of the second layer of semiconductor material 108 and is separated from adjacent columns of flash memory cells by an isolation region such that the body of each flash memory cell in a column is electrically coupled to the bodies of each other flash memory cell in that column but is electrically isolated from the bodies of each flash memory cell in other columns, to be described further herein. Two transistors will be shown in the first region 114 formed in a complementary arrangement, e.g., such as a complementary metal oxide semiconductor (CMOS) device, and only one floating gate transistor will be shown in the second region 116, in FIGS. 1 through 10; however, there may be hundreds or thousands of devices formed in the first region 114 and second region 116. There may be two or more first regions 114 and two or more second regions 116 formed on the SOI substrate 102, not shown in the Figures.

The pad nitride 112, the pad oxide 110, and the second layer of semiconductive material 108 are patterned with a pattern for shallow trench isolation (STI) in the first region 114 and the second region 116 of the workpiece 102. For example, a layer of photoresist (not shown) may be deposited over the pad nitride 112, and the layer of photoresist may be patterned using lithography. The patterned layer of photoresist is then used as a mask while exposed portions of the pad nitride 112 and pad oxide 110 are etched away. The pattern of the STI is also transferred to the second layer of semiconductive material 108 by etching the second layer of semiconductive material 108. Thus, the pattern of the STI comprises trenches is formed in the pad nitride 112, the pad oxide 110, and the second layer of semiconductive material 108, wherein the trenches extend fully to the top surface of the buried oxide layer 106. The etch process for the second layer of semiconductive material 108 may be adapted to stop when the buried oxide layer 106 is reached, for example. Another well-known patterning method to replace above mentioned resist mask is to use a hard mask (e.g., an oxide layer) to generate sub-nanometer technology node STI patterning for etching and filling, for example.

An optional liner 118 may be formed on the sidewalls and bottom surface of the STI trenches. The liner 118 may comprise about 20 nm or less of an oxide such as silicon dioxide, for example, although the liner 118 may alternatively comprise other dimensions and materials. The liner 118 may be formed by oxidizing the sidewalls of the trenches, e.g., by exposing the device 100 to oxygen or a mixture of oxygen and nitrogen, e.g., to form a liner 118 comprising an oxide or oxynitride, for example. The liner 118 may form on the sidewalls of the pad oxide 110 but not on the sidewalls of the pad nitride 112, as shown, for example. The liner 118 is optional and repairs the surface of the trenches after the etch process to form the STI trenches, for example, for stress relief.

The STI trenches lined with the optional oxide liner 118 are filled with an insulating material 120 that may comprise silicon dioxide, for example. The STI trenches may be filled by depositing high density plasma (HDP) oxide or by a flow-fill process, as examples, although other methods and materials may be used. Any excess insulating material 120 is removed from the top surface of the pad nitride 112, e.g., using a chemical mechanical polishing (CMP) process. The liner 118 and the insulating material 120 comprise STI regions 118/120 for adjacent devices formed in the first region 114 and the second region 116, and also comprise STI regions 118/120 for isolating devices in the first region 114 from devices in the second region 116, for example. The STI regions 118/120 are also referred to herein as isolation regions, for example. The pad nitride 112 and the pad oxide 110 are then removed.

Next, referring to FIG. 3, which shows a cross-sectional view of the semiconductor device 100 along a wordline direction (e.g., a cross-sectional view along a bitline direction disposed substantially perpendicular to the wordline direction would show a different structure, to be described and shown further herein). The exposed top surface of the second layer of semiconductive material 108 is implanted with dopants to form wells 122a and 124 in the first region 114 and well 122b in the second region 116, as shown. For example, a layer of photoresist (not shown) may be deposited and patterned, and P type dopants may be implanted to form wells 122a and 122b simultaneously in the first region 114 and the second region 116. Then the layer of photoresist is removed, and another layer of photoresist (also not shown) may be deposited and patterned, and N type dopants may be implanted to form well 124 in the first region 114. The P-well 122a and the N-well 124 may comprise the wells of the CMOS device, for example, which may comprise logic and/or high voltage (HV) devices, as examples. The P-well 122b preferably comprises the P-well or "body" of a flash memory array in the second region 116, for example. The bodies 122b of each flash memory cell within a column are preferably formed in a continuous well within a continuous region of the second layer of semiconductive material 108, which also referred to herein as a semiconductor layer, for example.

A thin insulating layer 126 is then formed over the second layer of semiconductive material 108. The thin insulating layer 126 preferably comprises an oxide, such as silicon dioxide or SiON, although the thin insulating layer 126 may alternatively comprise high k dielectric materials, such as $Al_2O_3$ or HfSiON, combinations or multiple layers thereof, or combinations or multiple layers thereof with silicon dioxide, as examples, although other materials may also be used. The thin insulating layer 126 preferably comprises a thickness of about 20 nm or less, and in one embodiment, more preferably comprises a thickness of about 7 to 10 nm, as examples, although the thin insulating layer 126 may alternatively comprise other dimensions. The thin insulating layer 126 may be formed by thermal oxidation of the exposed second layer of semiconductive material 108 at an elevated temperature, typically at about 900 to 1050 degrees C., for a few minutes in an oxygen or oxynitride environment, for example, although the thin insulating layer 126 may alternatively be formed by other methods. The thin insulating layer 126 forms the floating gate oxide of the flash memory cell in the second region 116. The thin insulating layer 126 may not form over the top surface of the STI regions 118/120, because an oxide material such as material 120 generally does not oxidize, for example, as shown.

A layer of conductive material 128 is deposited or formed over the thin insulating layer 126, as shown in FIG. 3. The layer of conductive material 128 preferably comprises a semiconductive material, and may alternatively comprise a metal or a semiconductor material and a metal, as examples. In one embodiment, the layer of conductive material 128 preferably comprises about 150 nm or less, e.g., about 90 nm, of polysilicon that is in-situ low doped, e.g., with N type dopants, for an N-channel flash memory device. Alternatively, the layer of conductive material 128 may comprise other materials and/or may be in-situ low doped with P type dopants, for example, for a P-channel flash memory device, and the layer of conductive material 128 may comprise other dimensions. The conductive material 128 will form the floating gate of the flash memory cell in the second region 116.

A layer of photoresist 130 is formed over the top surface of the layer of conductive material 128, as shown in FIG. 3. The layer of photoresist 130 functions as a mask to form the floating gates of the flash memory cells in the bitline direction in the second region 116, and thus the layer of photoresist 130 may also be referred to as a "floating gate mask." The layer of photoresist 130 is patterned to remove part of the layer of photoresist 130 from over the STI 118/120 in the second region 116 and portions of the first region 114, as shown, exposing part of the layer of conductive material 128 on top of the STI in the second region 116 and portions of the first region 114. The exposed layer of conductive material 128 in the second region 116 and portions of the first region 114 is removed from over the STI 118/120 by an etch process, e.g., using a reactive ion etch (RIE) and using the layer of photoresist 130 as a mask, although alternatively, other etch processes may be used. The etch process stops on the thin insulating layer 126, and may form slots that extend in a direction in and out of the page (e.g., the piece of paper this text is printed on), in the layer of conductive material 128, forming separating floating gates 128 for each flash memory cell, for example, as shown in FIG. 4. The conductive material 128 in the second region 116 comprises strips of the conductive material 128 running in the bitline direction, e.g., in and out of the paper. The layer of photoresist 130 is then removed.

Referring to FIG. 4, which shows a cross-sectional view of the semiconductor device 100 along the wordline direction, an insulating layer 132 is formed over the layer of conductive material 128 and over the exposed portions of the STI region 118/120. The insulating layer 132 preferably comprises a thickness of about 12 to 25 nm, and may comprise a tri-layer of oxide/nitride/oxide (ONO) in one embodiment, as examples, although alternatively, the insulating layer 132 may comprise a high k dielectric material such as $HfSiO_2$, HfSiON, $Al_2O_3$, or other materials and dimensions. The insulating layer 132 will form the insulating layer between the floating gate and the control gate of the flash memory cell in the second region 116, to be described further herein. The insulating layer 132 is also referred to herein as an interpoly dielectric 132 or an ONO layer 132, for example.

In one embodiment, the insulating layer 132 may comprise a first layer comprising a low temperature polysilicon oxide, a second layer comprising a low pressure chemical vapor deposition (LPCVD) nitride disposed over the first layer, and a third layer comprising a high temperature oxide disposed over the second layer. For example, the first layer may be formed by thermal oxidation of the semiconductor device 100 to about 900 degrees C., and exposing the conductive material 128 to oxygen; the second layer may be formed by depositing silicon nitride using LPCVD, and the third layer may be formed by heating the semiconductor device 100 in the presence of steam to oxidize the second layer at a temperature of about 900 degrees C., and/or depositing oxide or re-oxidizing the second layer of nitride to form silicon dioxide.

Another layer of photoresist 134 is deposited over the insulating layer 132, as shown in FIG. 4. The layer of photoresist 134 is patterned to expose the first region 114 of the workpiece 102.

Figure 5:
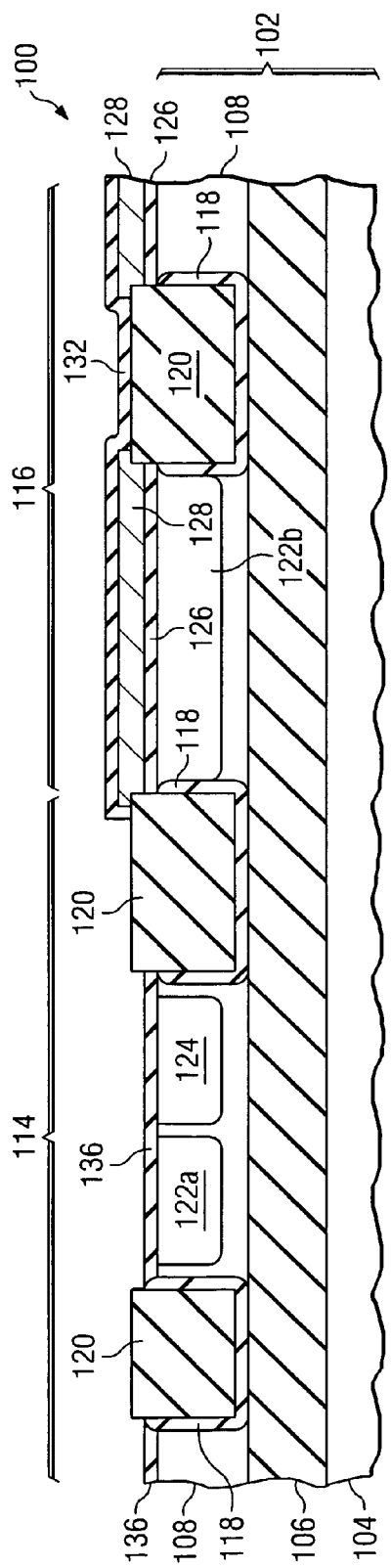

The exposed insulating layer 132, the conductive material 128, and the insulating layer 126 in the first region 114 are etched away using the layer of photoresist 134 as a mask, as shown in a cross-sectional view of the semiconductor device 100 in the wordline direction in FIG. 5, exposing the wells 122*a* and 124 and second layer of semiconductor material 108 in the first region 114. An insulating layer 136 is formed over the wells 122*a* and 124 and second layer of semiconductor material 108 in the first region 114, e.g., by exposing the semiconductor device 100 to oxygen to oxidize the top surface of the wells 122*a* and 124 and second layer of semiconductor material 108, for example, although alternatively, the insulating layer 136 may be formed by other methods.

If the insulating layer 136 is to be used to form a thick gate oxide for high voltage circuitry (not shown) in the first region 114, another layer of photoresist (not shown) may be deposited and patterned over the insulating layer 136, exposing only low voltage circuitry areas (also not shown) in the first region 114, followed by a wet etch and resist strip, and another insulating layer 136 is thermally grown over the wells 122*a* and 124 and second layer of semiconductor material 108 in the first region 114. Thus, a thick and thin gate oxide for peripheral devices in the first region 114 may be formed in this manner, for example, according to the type of peripheral circuitry.

The insulating layer 136 preferably comprises silicon dioxide or other insulating material, for example. The insulating layer 136 preferably has a thickness that is suitable for the type of device or circuit in the first region 114 of the semiconductor device 100, for example. In particular, for peripheral devices in the first region 114 comprising high voltage devices and circuitry, the insulating layer 136 preferably has a thickness of about 12 to 24 nm for high voltage circuitry, for example. For peripheral devices in the first region 114 comprising low voltage devices and circuitry, the insulating layer 136 may comprise a thickness of about 1.5 to about 2.5 nm, as examples. More particularly, for example, low voltage devices in the first region 114 comprising low leakage devices preferably comprise an insulating layer 136 thickness of about 2 to 2.5, and more preferably in some embodiments, about 2.1 to 2.3 nm, and low voltage devices in the first region 114 comprising high performance devices preferably comprise an insulating layer 136 thickness of about 1.6 to 1.8 nm, as examples, although other thicknesses may alternatively be used. High performance devices, for example, may have an $I_{on}$ (drive current at a predetermined $V_{dd}$) of greater than about 800 μA/μm in 90 nm technology node and below for NFET devices, and may have an $I_{on}$ of greater than about 500 μA/μm at 90 nm and below for PFET devices, as examples. Alternatively, however, the insulating layer 136 may comprise other dimensions and materials, in accordance with embodiments of the present invention.

If the devices in the low voltage area of the first region 114 comprise logic applications, such as low voltage circuitry, e.g., having an operating voltage of about 3.0 V or less, and then the devices in the first region 114 may be further divided into low leakage areas. In this case, another layer of photoresist (not shown) may be deposited after the formation of the high voltage area over the insulating layer 136. The additional layer of photoresist is patterned to expose only the low leakage area in the first region 114 of the workpiece 102, followed by a wet etch and resist strip. Then, another insulating layer 136 is thermally grown over the wells 122*a* and 124, and over the second layer of semiconductor material 108 in the first region 114. The processing sequence is then resumed to follow the above discussion of the low voltage device insulating layer 136 formation. The dual formation of the insulating layer 136 is often referred to in the art as a "dual gate oxide" (DGO) 136 formation process, for example. The insulating layer 136 for low leakage areas preferably comprises a thickness of about 2 to 2.5 nm, and more preferably, may comprise a thickness of about 2.1 to 2.3 nm, in accordance with some embodiments of the present invention, as examples, in order to optimize low leakage and medium performance transistors in the optional low voltage circuit regions of the first region 114.

Thus, the insulating layer 136 may comprise one or more thicknesses, e.g., two or more thicknesses, or three or more thicknesses, in the first region 114 of the workpiece 102, depending on the insulating layer 136 required for the particular type of devices formed in the first region 144. The insulating layer 136 may comprise a gate dielectric material for the devices formed in the peripheral or first region 114, for example.

Note that the sequence of forming the insulating layer 136 for high voltage circuit oxide and dual gate oxide processes are critical, and may start with thicker oxide and end with thinner oxide, to maintain thin oxide quality, which is required at the speed path circuitry. Care must be taken into account for partial oxide removal during each resist strip and cleaning step, and added oxide growth on top of each region during each of its thermally grown cycle, to make up the final oxide 136 thickness. The insulating layer 132 in the second region 116 experiences similar growth on the top oxide of the ONO layer 132, but preferably, the final ONO layer 132 thickness remains unchanged in the second region 116, after the formation of the insulating layer 136 in the first region 114, in accordance with embodiments of the present invention, for example.

Figure 6:
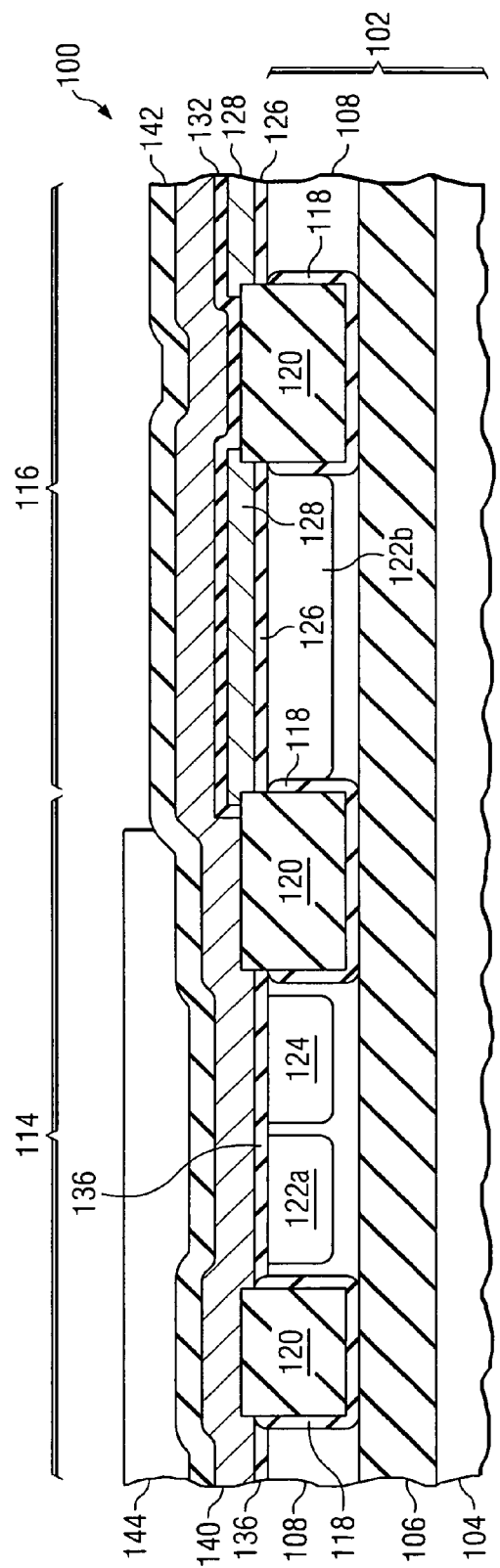

Another conductive layer 140 is formed over the layer of oxide 136 and STI region 118/120 in the first region 114, and over insulating layer 132 and STI region 118/120 in the second region 116, as shown in FIG. 6. The conductive layer 140 preferably comprises a semiconductive material such as polysilicon, and preferably comprises a thickness of about 90 to 110 nm, as an example, although alternatively, the conductive layer 140 may comprise other materials and dimensions. The conductive layer 140 forms the control gates of the flash memory cells in the second region 116, over the interpoly dielectric 132. The conductive material 128 disposed beneath the interpoly dielectric 132 forms the floating gates of the flash memory cells, and the insulating layer 126 disposed beneath the conductive material 128 forms the floating gate oxide of the flash memory cells in the second region 116, as shown in FIG. 6, which shows a cross-sectional view of the semiconductor device 100 in the wordline direction.

An insulating layer 142 is deposited over the conductive layer 140. The insulating layer 142 preferably comprises about 10 to 100 nm of tetra ethyl oxysilane (TEOS), as an example, although alternatively, the insulating layer 142 may comprise other materials and dimensions. A layer of photoresist 144 is deposited over the insulating layer 142 and patterned with a desired pattern for the control gates of the flash memory cells in the second region 116. An anti-reflective coating (not shown) may also be included in the layer of photoresist 144/insulating layer 142 stack. The insulating layer 142 comprises a hard mask for patterning the flash memory cell control gates 140, for example.

The layer of photoresist 144 is used as a mask to pattern the insulating layer 142. The layer of photoresist 144 is used as a mask to pattern the control gate and floating gate in the wordline direction, and thus may also be referred to as a "stacked gate mask." The layer of photoresist 144 may or may not be removed, and the insulating layer 142, and optionally, also the photoresist 144 may be used as a mask to pattern the conductive layer 140 and the interpoly dielectric 132, as well as the first conductive layer 128, with the etch process stopping on the insulating layer 126 in the second region 116, as shown in a cross-sectional view in FIG. 7, which shows the semiconductor device 100 in the bitline direction (note that the previous figures show a view of the semiconductor device 100 in the wordline direction). For example, a RIE process may be used to pattern the conductive layer 140, the interpoly dielectric 132, and the conductive layer 128. The flash memory cell gates in the second region 116 after the stacked gate mask etch process comprise a rectangular floating gate 128 in the wordline direction and a control gate 140 comprising a relatively long strip of conductive material 140 along the wordline direction, for example.

Figure 7:
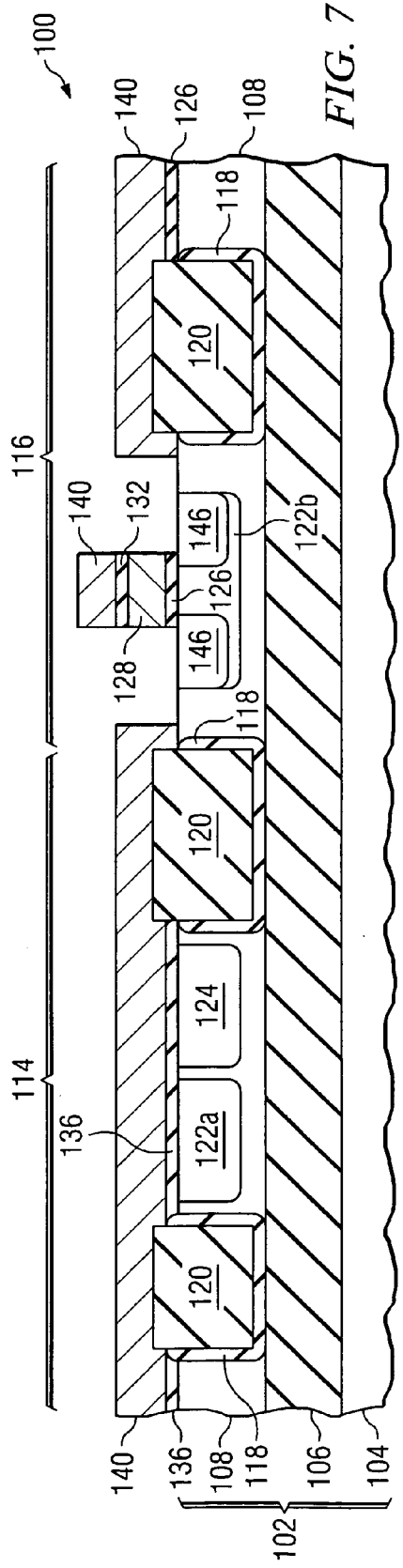

Next, an implantation process is used to form the source and drain regions 146 within the well 122b in the second region 116, e.g., through the insulating layer 126, also shown in FIG. 7. For example, if the well 122b comprises a P-well, the source and drain regions 146 comprise N junctions. The semiconductor device 100 is then annealed to diffuse the implanted dopants and form the source and drain regions 146, for example. The insulating layer 142 comprising a hard mask is then removed, e.g., using a RIE or other removal process in the first region 114 as well as second region 116. Portions of the insulating layer 126 in areas other than the gate stack 140/132/128/126 are also removed.

Figure 8:
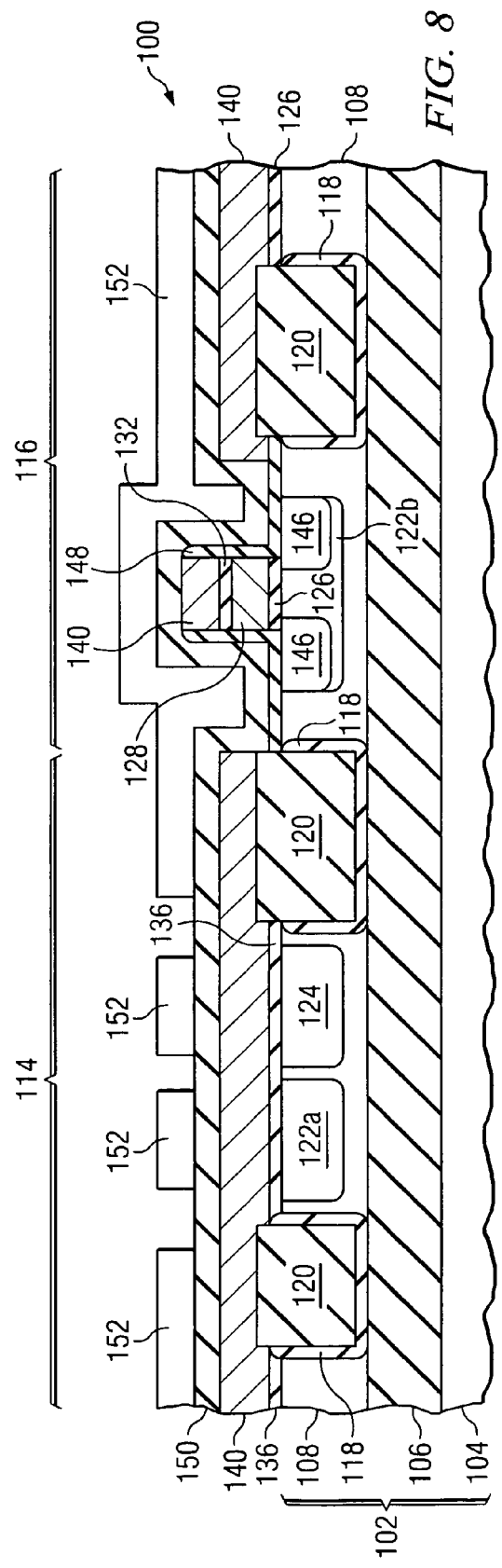

Referring next to FIG. 8, which shows the semiconductor device 100 again in the bitline direction in a cross-sectional view, after the hard mask 142 is removed, a sidewall insulator 148 is formed on the sidewalls of the control gate 140, interpoly dielectric 132, floating gate 128, and floating gate oxide 126, e.g., by exposing the semiconductor device 100 to an oxygen-containing substance in a furnace, for example, although other methods may also be used. A small amount of oxide, e.g., about 10 to 20 nm, may also be grown on exposed Si surfaces in areas other than the gate stack 140/132/128/126, as well on top of layer 140 in regions 114 and 116, for example.

An insulating layer 150 comprising TEOS or other hard mask material, for example, although other materials may also be used, is deposited over the sidewall insulator 148 in the second region 116 as well as over the conductive layer 140 in the first region 114, exposed portions of the second layer of semiconductor material 108, and the conductive layer 140, as shown in FIG. 8. A layer of photoresist 152 is deposited over the insulating layer 150, and the layer of photoresist 152 is patterned with a desired pattern for the gates of peripheral devices in the first region 114. The pattern of the layer of photoresist 152 is transferred to the insulating layer 150, and the layer of photoresist 152 and/or insulating layer 150 are used as a mask while portions of the conductive layer 140 and insulating layer 136 are etched away to form gates 140 and gate oxide 136 of peripheral devices 162 in the first region 114, as shown in FIG. 9. Exposed portions of the second layer of semiconductor material 108 are implanted with dopants to form lightly doped drain (LDD) extensions 154 and 156, e.g., if the peripheral devices 162 comprise high voltage devices. For example, LDD extensions 154 preferably comprise N-doped regions formed in P-wells 122a, and LDD extensions 156 preferably comprise P-doped regions formed in N-wells 124. Finally, the hard mask layer 150 is removed from both regions 114 and 116.

Figure 11:
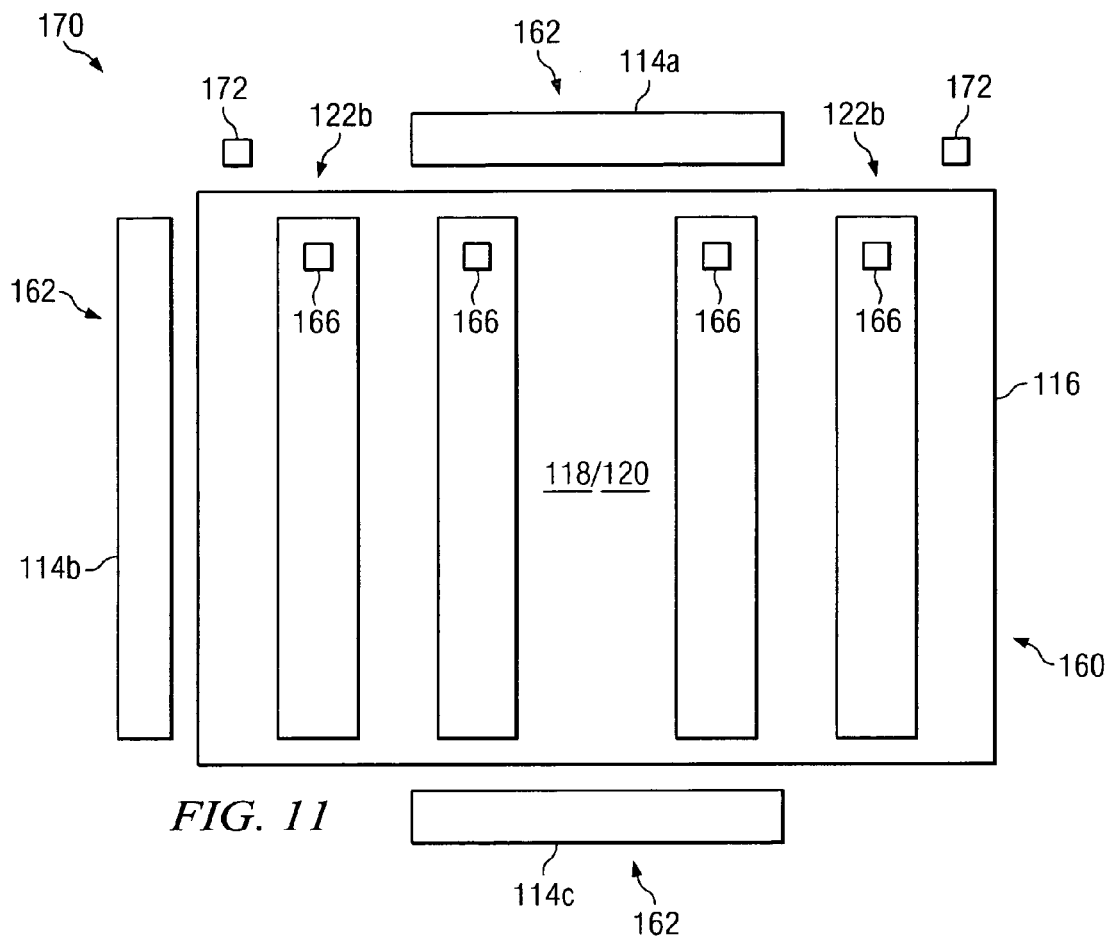
FIG. 11 shows a top view of an embedded flash memory device manufactured in accordance with an embodiment of the present invention.

A sidewall insulator 158 is formed on sidewalls of the gates 140 and gate oxide 136 of peripheral devices 162 in the first region 114. The sidewall insulator 158 is preferably formed by a rapid thermal anneal (RTA) process, which may have a much lower thermal budget than the formation of sidewall 148 for the flash memory devices in the second region 116, for example. Processing of the semiconductor device 100 is then continued, for example, optionally forming additional spacers, source and drain implantation processes and anneal processes, forming silicide (not shown) on the gates 140 in the first and second regions 114 and 116, depositing insulating material 164, forming source and drain contacts (not shown) that land on layer 146, forming P-well contacts 166 that land on P+ diffusion regions over P-well 122b, as shown in FIG. 10, and forming P-substrate contacts 172 over a P substrate within the workpiece 102, as shown in FIG. 11.

Advantageously, the P-well contacts 166 provide electrical connection to the P-wells 122b or body of the flash memory devices 160 in the second region 116 for each column or bitline of the flash memory cells, so that the P-wells 122b may be biased or connected to a predetermined voltage level. For example, the P-wells 122b are preferably biased to a voltage level of about +/−10 volts or less, and more preferably are biased to a voltage level of about +/−3 to 9 volts, pending selected or unselected bitlines. For example, if a bitline or column is selected, a negative voltage would be used to bias the selected P-well 122b of the selected column of flash memory cells more negatively than if the bitline was not selected, in which case, the same voltage but with a positive polarity would be used to bias the unselected P-well 122b of the unselected column of flash memory cells. However, alternatively, the P-wells 122b may be biased to other voltage levels, for example.

When a P-well 122b is biased negatively, the overall vertical field (e.g., the sum of gate-to-well field) is enhanced, a favorable condition for electrons tunneling from the channel regions in the P-well 122b to the floating gate. However, when the P-well 122b is biased positively, the overall gate-to-well vertical field is reduced, known as an inhibited effect, which is a necessary condition to suppress electron tunneling from occurring, thus reducing an effect known as "program disturb," such as in unselected columns. Thus, an additional advantage of embodiments of the present invention is providing a flash memory device 100 design wherein P-wells 122b are disposed on top of and directly adjacent a layer of buried oxide 106 in the SOI substrate 102, replacing a triple well construction, yet still providing sufficient isolation to permit the bias flexibility of the P-wells.

Additional processing of the semiconductor device 100 is then continued. For example, contacts (not shown) may be formed to make contact to the gates 140 in the first region 114 and second region 116 within the insulating material 164.

Embodiments of the present invention may be implemented in flash memory cell structures comprising twin-wells, as shown in FIGS. 1 through 9, or alternatively, in triple well configurations. For example, in FIG. 10, a triple well 168 is formed in the second layer of semiconductive material 108. However, advantageously, embodiments of the present invention allow the fabrication of flash memory cells comprising only twin-wells and requiring no deep trench isolation module, thus eliminating many processing steps required to form a third (e.g., triple) well and deep trench isolation modules.

Figure 12:
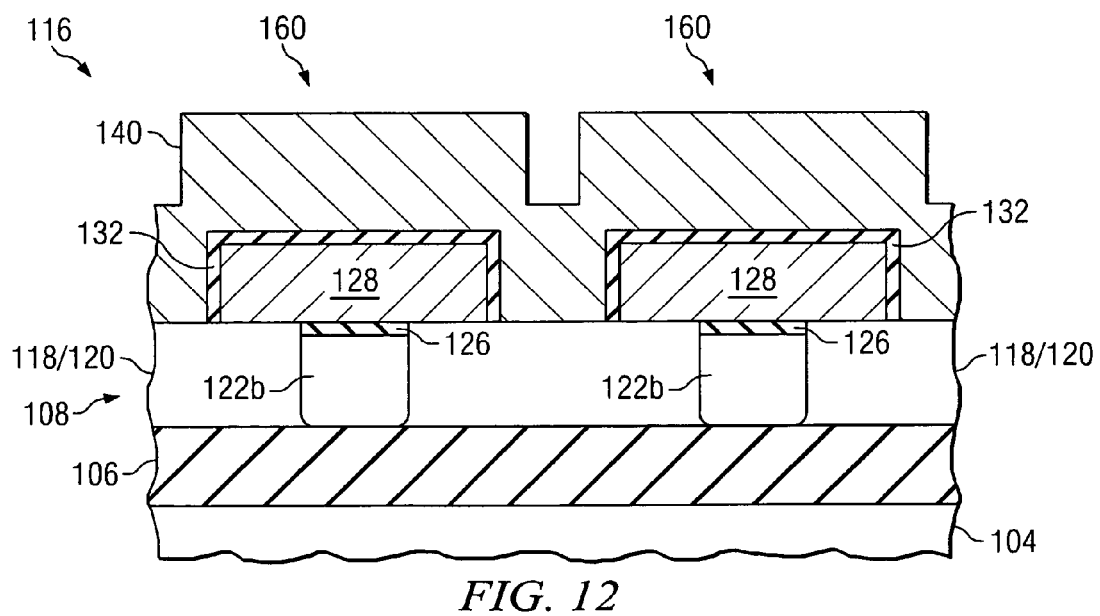
FIG. 12 shows a cross-sectional view of a portion of the flash memory array region shown in FIG. 11.

A top view 170 of an embedded flash memory cell array that includes peripheral devices (e.g., in first regions 114a, 114b, and 114c) formed proximate the array of flash memory cells (e.g., in second region 116), manufactured in accordance with an embodiment of the present invention, is shown in FIG. 11, wherein the metal layers are omitted (e.g., the bit-lines run perpendicular to 114a, and the wordlines are not shown but run perpendicular to 114b). A cross-sectional view of a portion of the second region 116 is shown in FIG. 12 along the wordline direction. The top view 170 shows the first region 116 that comprises a plurality of flash memory cells 160 arranged in an array, with columns of the active areas of the flash memory cells 160, left and right, separated by isolation region 118/120, e.g., at 122b, being coupled together (in and out of the page). The peripheral devices 162 may comprise a column decoder and column driver in first region 114a, a row decoder and row driver in first region 114b, and a well decoder in first region 114c, and the peripheral devices 162 may comprise high voltage components, as examples. There may be other first regions 114 comprising logic or power circuits in the device, not shown, for example. Contact may be made to the first layer of semiconductor material 104 of the SOI substrate 102 by contacts 172 that extend through the second layer of semiconductor material 108 and the buried oxide layer 106, for example.

The P-wells 122b of the plurality of flash memory cells 160 in the array in the second region 116 are separated by STI isolation 118/120 and by the buried oxide 106. However, advantageously, contacts 166 make electrical contact to the P-wells 122b and allow the ability to bias the selected P-wells 122b independently from adjacent P-wells 122b, providing enough isolation to prevent well-to-well punch-through that may result from forward-biasing of the well; thus resulting in improved performance and reliability of the flash memory cells 160 by avoiding floating body effects and cutting off GIDL leakage current to allow lower power operation and overall area reduction, through charge pump reduction and HV scaling, by splitting the writing voltage to the wordline and well 122b bias.

For example, the bodies or P-wells 122b of the flash memory cells 160 in each column may be coupled to a voltage supply terminal, e.g., using contacts 166 disposed between the STI regions 118/120, forming an independent bias scheme for the bodies 122b of the flash memory cells 160. A well decoupler circuit, e.g., formed in peripheral or first region 114c may be coupled to each column of flash memory cells 160, wherein the well decoupler circuit is adapted to latch the bodies 122b of each flash memory cell 160 in a column independently with respect to the other columns, for example.

Embodiments of the present invention include structures for semiconductor devices and methods of manufacturing thereof. In summary, the semiconductor devices include a plurality of flash memory cells formed on an SOI substrate, with each flash memory cell having a body, and wherein the plurality of flash memory cells is arranged in an array of rows and columns. Each column of flash memory cells is formed in a continuous region of the semiconductor layer of the SOI substrate (e.g., in layer 108) and is separated from adjacent columns of flash memory cells by an isolation region, such that the body of each flash memory cell in a column is electrically coupled to the bodies of each other flash memory cell in that column, but is electrically isolated from the bodies of each flash memory cell in other columns. The bodies of each flash memory cell in a column are formed in a continuous well within the continuous region of the semiconductor layer.

In some embodiments, the body of each flash memory cell comprises a first well of a first conductivity type, wherein each flash memory cell further comprises a second well formed within the first well, the second well being doped to a second conductivity type that is different than the first conductivity type. In some embodiments, the body of each flash memory cell is formed in a third well, with the third well being doped to the second conductivity type, for example.

Advantageously, an electrical connection is provided to each column of memory cells so that the body of each memory cell in any column can be biased independently with respect to the other columns of memory cells. For example, the bodies of each flash memory cell in each column may be coupled to a voltage potential, wherein a selected column is biased to a first potential, and unselected columns are biased to a second potential that is different than the first potential. The first potential may be less than a ground potential, and the second potential may be greater than a ground potential, although other configurations may also be used. As an example, the first potential may be about −3 V, and the second potential may be about +3 V.

In some embodiments, input/output transistors may be formed in the same region that the array of flash memory cells are formed in, e.g., in a portion of the region 116 (not shown in the figures,) wherein the input/output transistors have a dual gate oxide.

Embodiments of the present invention also include methods of operating flash memory arrays. For example, first, an array of flash memory cells is provided, wherein the array of flash memory cells is arranged in rows and columns, each flash memory cell having a body, and each column of flash memory cells being formed in a continuous region of semiconductor that overlies a buried insulator, e.g., of an SOI substrate, with each column being separated from adjacent columns of flash memory cells by an isolation region. Operating the flash memory array may include selecting a flash memory cell in one of the columns, applying a first voltage to the body of each flash memory cell in the one of the columns, applying a second voltage to the body of each flash memory cell in a column that is immediately adjacent the one of the columns, accessing the selected flash memory cell. Accessing the selected flash memory cell may comprise programming the selected flash memory cell, for example. The first voltage may be less than a ground potential, and the second voltage may be greater than the ground potential, as examples.

Table 1 shows some exemplary voltage levels used to operate embedded flash memory devices 160 that may be manufactured in accordance with embodiments of the present invention. The particular voltages here merely provide an example of how one particular memory array can be operated; other examples are also possible.

TABLE 1

|  | Read (V) | Program (V) | Erase (V) |
|---|---|---|---|
| Gate (selected) | Vpp (e.g., 2.5) | +14 | −14 |
| Drain (selected) | Vdd (e.g., 1.2) | −3 | +3 |
| Source/P-well (selected) | 0 | −3 | +3 |
| Gate (unselected) (drain disturb) | 0 (Drain turn-on) | 0/−3 | 0/+3 |

TABLE 1-continued

| | Read (V) | Program (V) | Erase (V) |
|---|---|---|---|
| Drain (unselected) (gate disturb) | 0 (Read disturb) | +3 | +3 |
| Source/P-well (unselected) | 0 | +3 | +3 |

Embodiments of the invention may be implemented in embedded flash memory devices, as described and shown in the figures, in system on a chip (SoC) devices such as microprocessors for high performance applications, microcontroller, or DSP for low power portable applications with other embedded memories such as SRAM or DRAM devices, as examples. Embodiments of the present invention may also be used in stand-alone flash memory arrays. For example, the manufacturing process steps described for the second region 116 shown in the figures may be implemented to manufacture a flash memory device.

The processing flow described herein requires a decreased number of lithography masks compared to prior art processes. For example, because an SOI substrate is used, the shallow trench isolation 118/120 is sufficient to isolate adjacent columns of flash memory cells 160 from one another; thus, a mask and lithography process to form deep trenches is not required. Furthermore, for applications where the peripheral devices in the first region 114 comprise high voltage devices, two lithography masks may be avoided, because in the first region 114, high voltage (HV) CMOS devices, e.g., having an operation voltage of about 12 volts or greater, may share the same masks for twin-wells with logic CMOS devices in the presence of the SOI substrate 102.

Using an SOI substrate 102 results in improved endurance for flash memory cells 160 in the second region 116, by avoiding floating body effects and cutting off GIDL leakage current, allowing lower power operation. This result leads to lower breakdown voltage for high voltage peripheral devices 162 in the first region 114, for example, due to overall HV scaling by splitting the writing voltage to the wordline and well bias. The flash memory cells 160 may comprise twin-wells rather than triple wells, eliminating the complexity of forming triple wells and the additional processing required to form the triple wells. Because the bodies (wells 122b) are coupled together and are biased to a predetermined voltage level, hot hole generation is prevented.

Devices manufactured in accordance with embodiments of the present invention have low gate induced drain leakage (GIDL) and stress induced leakage current (SILC); thus, the flash memory cells retain a charge longer and more reliably. Advantageously, the shallow trench isolation 118/120 for the flash memory cells 160 is formed simultaneously with the formation of shallow trench isolation 118/120 for peripheral devices 162. Fewer dedicated process flows are required to form the novel flash memory devices on SOI substrates, in accordance with embodiments of the present invention, saving time and lowering the cost of manufacturing. Furthermore, flash memory devices in the second region 116 and high voltage devices and logic devices in the first region 114 may comprise twin-wells (e.g., NFETs and PFETs) wherein the same lithography mask is used to form the NFETs and the PFETs of the flash memory devices, high voltage devices and logic devices, for example. This avoids the need to use a high energy implanter to form the twin-wells, which is often required to form high voltage devices, for example.

In some embodiments, high voltage devices may be formed in the at least one first region 114, wherein the high voltage devices advantageously share wells 122a and 124 (not shown in the figures) with low voltage devices, in the at least one first region 114, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a silicon-on-insulator (SOI) substrate, the SOI substrate including a substrate, a buried insulating layer disposed over the substrate, and a layer of semiconductor material disposed over the buried insulating layer;
   a plurality of isolation regions disposed in the layer of semiconductor material, wherein each isolation region extends completely through the layer of semiconductor material; and
   a plurality of flash memory cells formed on the SOI substrate, each flash memory cell having a source and drain in a body portion, the plurality of flash memory cells being arranged in an array of rows and columns, each column of flash memory cells being formed in a continuous region of the semiconductor layer and being separated from adjacent columns of flash memory cells by one of said isolation region such that the body portion of each flash memory cell in a column is electrically coupled to the body portions of each other flash memory cell in that column but is electrically isolated from the body portions of each flash memory cell in other columns; and
   an electrical connection to the body portions of said flash memory cells in each one of said column of said memory cell, said electrical connection being independent and separate such that the body portions of said memory cells in a column can be biased with respect to both said source and said drain and to a voltage level that is different from the body portions of flash memory cells in other columns.

2. The semiconductor device according to claim 1, wherein the body portions of each flash memory cell in a column are formed in a continuous well within the continuous region of the semiconductor layer.

3. The semiconductor device according to claim 2, wherein the body portions of each flash memory cell in a column are biased to a predetermined voltage.

4. The semiconductor device according to claim 3, wherein the predetermined voltage comprises about +/−10 volts or less.

5. The semiconductor device according to claim 1, wherein the body of each flash memory cell comprises a first well of a first conductivity type, wherein each flash memory cell further comprises a second well formed within the first well, the second well being doped to a second conductivity type that is different than the first conductivity type.

6. The semiconductor device according to claim 5, wherein the body of each flash memory cell is formed in a third well, the third well being doped to the second conductivity type.

7. The semiconductor device according to claim 1, wherein the semiconductor device comprises at least one first region and at least one second region, wherein a plurality of peripheral devices are formed in the at least one first region and the plurality of flash memory cells are formed in the at least one second region, wherein the peripheral devices perform functions unrelated to the access of information to or from the flash memory cells.

8. The semiconductor device according to claim 7, wherein one of the plurality of peripheral devices comprise a high voltage device comprising a gate dielectric material having a thickness of about 12 to 24 nm.

9. The semiconductor device according to claim 7, wherein the plurality of peripheral devices includes both logic devices and power devices.

10. The semiconductor device according to claim 7, further comprising a well decoupler circuit disposed within the at least one first region and being coupled to each column of flash memory cells, wherein the well decoupler circuit is adapted to latch the bodies of each flash memory cell in a column independently with respect to the other columns.

11. The semiconductor device according to claim 7 wherein one of the plurality of peripheral device comprises a low voltage device comprising a gate dielectric material having a thickness of about 1.5 to 2.5 nm.

12. The semiconductor device according to claim 11, wherein the low voltage devices is a low leakage device comprising a gate dielectric material having a thickness of about 2 to 2.5 nm.

13. The semiconductor device according to claim 11 wherein the low voltage device is a high performance device comprising a gate dielectric material having a thickness of about 1.6 to 1.8 nm.

14. The semiconductor device according to claim 1, wherein the semiconductor device comprises a stand-alone flash memory device.

15. The semiconductor device according to claim 1, wherein the isolation regions comprise shallow trench isolation regions.

* * * * *